US012575180B2

(12) United States Patent
Hu et al.

(10) Patent No.: US 12,575,180 B2
(45) Date of Patent: Mar. 10, 2026

(54) DISPLAY PANEL, METHOD OF MANUFACTURING SAME, AND DISPLAY DEVICE

(71) Applicant: Shenzhen China Star Optoelectronics Semiconductor Display Technology Co., Ltd., Shenzhen (CN)

(72) Inventors: Kai Hu, Shenzhen (CN); Fangmei Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 373 days.

(21) Appl. No.: 17/988,101

(22) Filed: Nov. 16, 2022

(65) Prior Publication Data

US 2024/0072062 A1 Feb. 29, 2024

(30) Foreign Application Priority Data

Aug. 30, 2022 (CN) .......................... 202211049318.X

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/421* (2025.01); *H10D 86/431* (2025.01)

(58) Field of Classification Search
CPC .... H10D 86/60; H10D 86/421; H10D 86/431; H10D 12/032; H10D 84/0109; H10D 30/031; A01G 13/20; H10F 77/937; H02K 15/027
See application file for complete search history.

(56) References Cited

U.S. PATENT DOCUMENTS

| | | | | |
|---|---|---|---|---|
| 2006/0214229 A1* | 9/2006 | Toyoda | .................. | H10D 86/40 |
| | | | | 257/E29.279 |
| 2022/0013608 A1* | 1/2022 | Kim | .................... | H01L 27/1225 |
| 2022/0115540 A1* | 4/2022 | Cheng | ................ | H10D 30/6729 |

FOREIGN PATENT DOCUMENTS

| | | |
|---|---|---|
| CN | 113140637 A | 7/2021 |
| CN | 113314615 A | 8/2021 |
| KR | 20140139773 A | 12/2014 |

OTHER PUBLICATIONS

Chinese Office Action issued in corresponding Chinese Patent Application No. 202211049318.X dated Aug. 24, 2024, pp. 1-8.

* cited by examiner

*Primary Examiner* — Mohammed R Alam
(74) *Attorney, Agent, or Firm* — Nathan & Associates Patent Agents Ltd.; Menachem Nathan

(57) ABSTRACT

The display panel includes a substrate and a plurality of thin film transistors disposed on the substrate. Each of the thin film transistors includes: a semiconductor layer on the substrate. The semiconductor layer includes a channel portion and conductor portions disposed on both sides of the channel portion. A gate electrode is defined with a first length, the channel portion is defined with a second length, and a ratio of the second length to the first length is greater than 0.7 and is less than or equal to 1.

16 Claims, 5 Drawing Sheets

100

10

DISPLAY PANEL, METHOD OF MANUFACTURING SAME, AND DISPLAY DEVICE

BACKGROUND OF PRESENT APPLICATION

Field of Present Application

The present application relates to a field of display technology, and specifically to a display panel, a method of manufacturing the same, and a display device.

Description of Prior Art

At present, with an increasing demand for display panels, notability of performances of the display panels is growing with each passing day, so how to improve the performances of the display panels is a research hotspot for researchers in industry. Improvement of thin film transistors is a major research direction of the performances of the display panels and has been widely concerned by researchers. The inventor found that during a formation of the thin film transistors, due to high carrier concentration of a conductor portion of a semiconductor layer, it is easy for carriers to diffuse to a channel portion and results in an actual length of the channel portion far less than an expected length of the channel portion, which leads to a failure of the thin film transistors.

Therefore, a display panel, a method of manufacturing the same, and a display device solved the above technical problem are urgently needed.

SUMMARY OF PRESENT APPLICATION

The present application provides a display panel, a method of manufacturing the same, and a display device, which can alleviate a technical problem of a failure of thin film transistors caused by a fact that an actual length of a channel portion of a semiconductor layer is far less than an expected length of the channel portion.

The present application provides a display panel including a substrate and a plurality of thin film transistors disposed on the substrate, wherein each of the thin film transistors includes:

a semiconductor layer located on the substrate, wherein the semiconductor layer includes a channel portion and conductor portions located on two sides of the channel portion; and a gate electrode located on the semiconductor layer, wherein an orthographic projection of the channel portion on the substrate is located within an orthographic projection of the gate electrode on the substrate, the gate electrode is defined with a first length, the channel portion is defined with a second length, and a ratio of the second length to the first length is greater than 0.7 and is less than or equal to 1.

Each of the conductor portions includes a first concentration area and a second concentration area, the first concentration area is located at a side of a conductor portion close to the channel portion, and the second concentration area is located at a side of the first concentration area away from the channel portion; and wherein a carrier concentration of parts of the conductor portions located in the first concentration area is less than a carrier concentration of parts of the conductor portions located in the second concentration area.

The display panel further includes a gate insulating layer located between the gate electrode and the semiconductor layer, and the gate insulating layer includes blocking portions located at two sides of the gate electrode; and wherein the blocking portions are located within a projection of the first concentration area in a top view direction of the display panel.

The blocking portions includes a first barrier sub-portion located at one side of the gate electrode and a second barrier sub-portion disposed oppositely at another side of the gate electrode, and in the top view direction of the display panel, the first barrier sub-portion is defined with a third length, and the second barrier sub-portion is defined with a fourth length; and wherein the third length is greater than 0.85 μm and is less than or equal to 1.8 μm, and the fourth length is greater than 0.85 μm and is less than or equal to 1.8 μm.

The third length is greater than or equal to 1.2 μm and is less than or equal to 1.8 μm, and the fourth length is greater than or equal to 1.2 μm and is less than or equal to 1.8 μm.

The display panel further includes an interlayer insulating layer, and the interlayer insulating layer covers parts of the semiconductor layer, the blocking portion, and the gate electrode; and wherein an ion concentration of the blocking portion is greater than an ion concentration of the interlayer insulating layer.

The ratio of the second length to the first length is greater than or equal to 0.8 and is less than or equal to 1.

A threshold voltage of each of the thin film transistors ranges from −0.76 V to 0.22V.

The present application further provides a display device, the display device includes the display panel as described above and a device body, and the device body is integrated with the display panel as a whole.

The present application further provides a method of manufacturing a display panel, including:

forming a semiconductor material layer on a substrate;

forming a barrier material layer on the semiconductor material layer;

forming a first metal layer on the barrier material layer;

patterning the first metal layer and the barrier material layer to form a gate electrode and a gate insulating layer, and to expose a part of the semiconductor material layer; and conductorizing the semiconductor material layer to form a semiconductor layer, wherein the semiconductor layer includes a channel portion and conductor portions located on both sides of the channel portion respectively, an orthographic projection of the channel portion on the substrate is located within an orthographic projection of the gate electrode on the substrate, each of the gate electrode is defined with a first length, each of the channel portion is defined with a second length, and a ratio of the second length to the first length is greater than 0.7 and is less than or equal to 1.

In the present application, by controlling the ratio of the second length of the channel portion to the first length of the gate electrode to be greater than 0.7 and less than or equal to 1 in the top view direction of the display panel, the threshold voltage of the thin film transistors is closer to 0 V, thereby improving failure of the thin film transistors caused by excessive negative threshold voltages, so as to improve a device performance of the thin film transistors.

BRIEF DESCRIPTION OF DRAWINGS

In order to illustrate technical solutions in embodiments of the present application more clearly, the following briefly introduces drawings needed to be used in description of the embodiments. Obviously, the drawings in the following description are only some embodiments of the present application. For those skilled in the art, other drawings can be obtained from these drawings without creative effort.

DETAILED DESCRIPTION OF EMBODIMENTS

In combination with drawings in embodiments of the present application, technical solutions in the embodiments of the present application will be described clearly and completely. Obviously, the described embodiments are only part of the embodiments of the present application, but not all of them. Based on the embodiments of the present application, all other embodiments obtained by those skilled in the art without creative work fall within a scope of the present application. In addition, it should be understood that specific embodiments described herein are only used to explain and interpret the present application and are not used to limit the present application. In the present application, unless otherwise described, location words, such as "up" and "down", generally refer to the upper and lower part of a device in an actual use or a working state for detail, please refer to the drawings. "Inside" and "outside" are relative to an outline of the device.

At present, because of a diffusion problem of carriers from a conductor portion of a semiconductor layer of a thin film transistor to a channel portion during a manufacturing process, an actual length of the channel portion is far less than an expected length, resulting in negative threshold voltages of the thin film transistor, which leads to failure of the thin film transistors.

Figure 1:
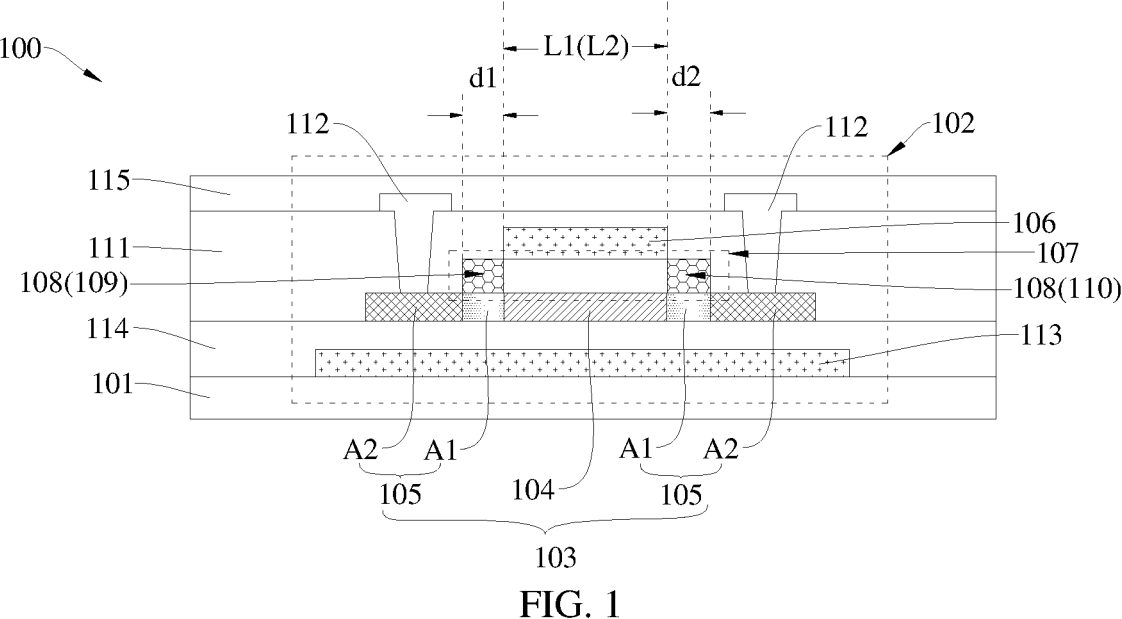
FIG. 1 is a first schematic structural diagram of a display panel provided by an embodiment of the present application.
Figure 2:
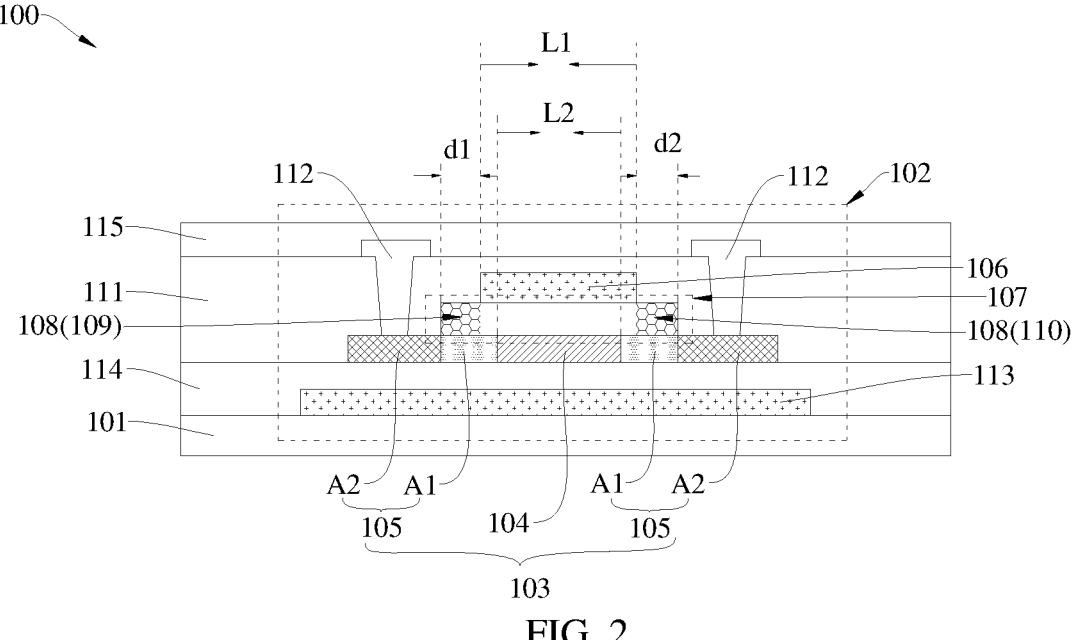
FIG. 2 is a second schematic structural diagram of the display panel provided by the embodiment of the present application.
Figure 3:
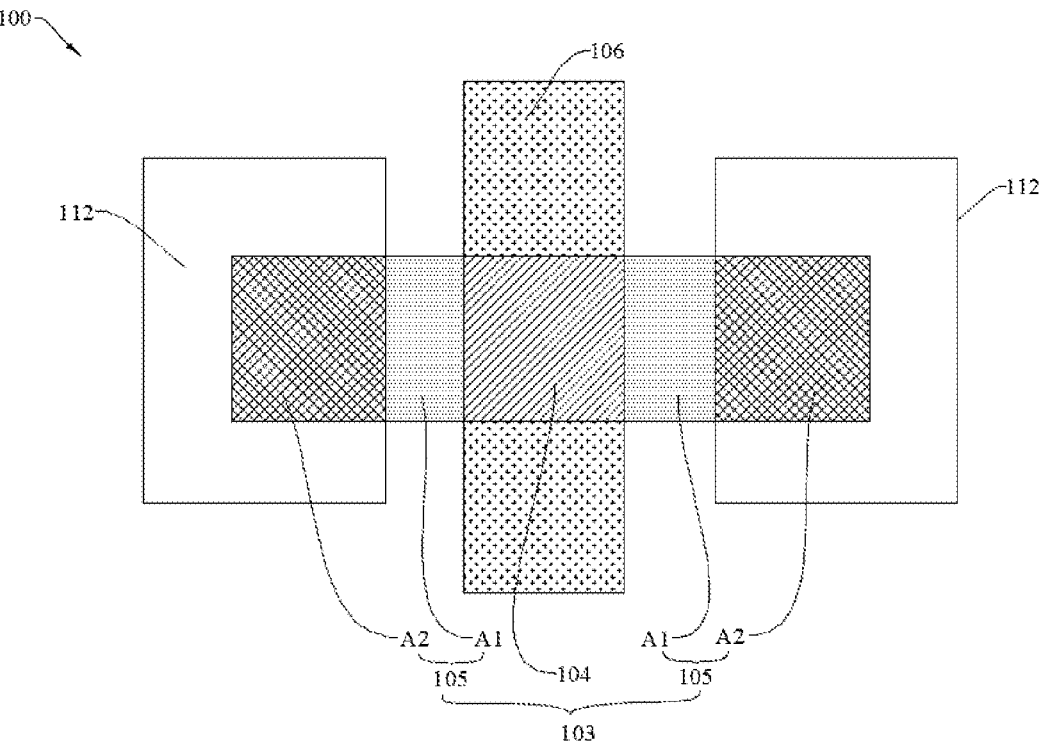
FIG. 3 is a third schematic structural diagram of the display panel provided by the embodiment of the present application.
Figure 4:
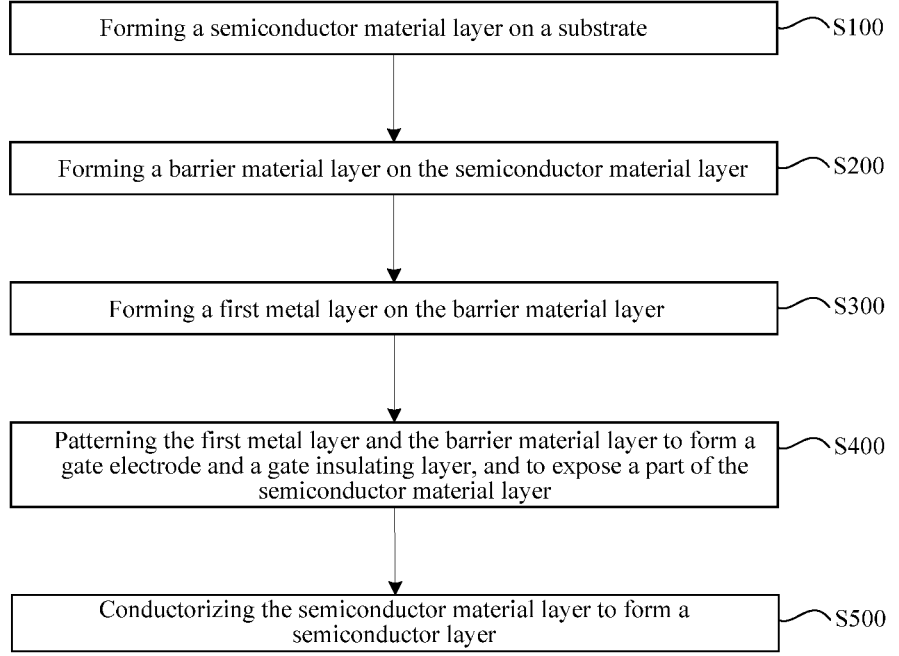
FIG. 4 is a flow chart of steps of a method of manufacturing a display panel provided by an embodiment of the present application.

Referring to FIG. 1 to FIG. 3, an embodiment of the present application provides a display panel 100. The display panel 100 includes a substrate 101 and a plurality of thin film transistors 102 located on the substrate 101. Each of the thin film transistors 102 includes:

a semiconductor layer 103 located on the substrate 101, wherein the semiconductor layer 103 includes a channel portion 104 and conductor portions 105 located on both sides of the channel portion 104; and a first gate electrode 106 located on the semiconductor layer 103, wherein an orthographic projection of the channel portion 104 on the substrate 101 is located within an orthographic projection of the first gate electrode 106 on the substrate 101, the first gate electrode 106 is defined with a first length L1, the channel portion 104 is defined with a second length L2, and a ratio of the second length L2 to the first length L1 is greater than 0.7 and is less than or equal to 1.

When the ratio of the second length L2 to the first length L1 is less than or equal to 0.7, a performance of the thin film transistors 102 is actually difficult to be improved, and a problem of the thin film transistors 102 failure can not be improved. When the ratio of the second length L2 to the first length L1 is greater than 1, a problem of incontrollable switches of the thin film transistors 102 easily occurs and affects product quality of the thin film transistors 102.

A top view direction of the display panel 100 is a direction perpendicular to a light emitting surface of the display panel 100 and opposite to a light emitting direction of the display panel 100.

In the top view direction of the display panel 100, the first gate electrode 106 includes a first side and a second side disposed opposite to the first side. The semiconductor layer 103 includes a third side parallel to the first side and a fourth side parallel to the second side. The first length L1 is a distance between the first side and the second side. In the top view direction of the display panel 100, the first side is close to the third side, and the second side is close to the fourth side. In the top view direction of the display panel 100, the channel portion 104 includes a fifth side close to the third side and a sixth side close to the fourth side. The second length L2 is a distance between the fifth side and the sixth side.

Through experimental researches, the inventor found that the ratio of the second length L2 of an actually formed channel portion 104 to the first length L1 of the first gate electrode 106 is less than or equal to 0.7. It leads to negative threshold voltages of the thin film transistors, and results in failure of the thin film transistors. For example, when the ratio of the second length L2 to the first length L1 ranges from 0.65 to 0.7, a sampling of the threshold voltages of the thin film transistors at different points of a display motherboard in a process of manufacturing the display panel 100 shows that the sampled threshold voltages of the thin film transistors range from −19.7V to −3.7V. That is, the threshold voltages of the thin film transistors obtained at different sampling points are generally negative, and differences of the threshold voltages between the thin film transistors at different sampling points are larger. It causes not only the failure of the thin film transistors, but also difficulty in control product quality of the display motherboard between different display panels 100.

In the top view direction of the display panel 100, by keeping the ratio of the second length L2 of the channel portion 104 to the first length L1 of the first gate electrode 106 greater than 0.7 and less than or equal to 1, the present application provide the threshold voltage of each of the thin film transistors 102 closer to 0 V, thereby improving the failure of the thin film transistors 102 caused by excessive negative threshold voltages, so as to improve a device performance of the thin film transistors.

Technical solutions of the present application will be described in combination with embodiments.

Referring to FIG. 1 to FIG. 3, in the embodiment, each of the conductor portions 105 includes a first concentration area A1 and a second concentration area A2. The first concentration area A1 is located on a side of the conductor portions 105 close to the channel portion 104, and the second concentration area A2 is located on a side of the first concentration area A1 away from the channel portion 104. A carrier concentration of parts of the conductor portions 105 in the first concentration area A1 is less than a carrier concentration of parts of the conductor portions 105 in the second concentration area A2.

By reducing the carrier concentration of the first concentration area A1 located near the channel portion 104, it is beneficial to reduce diffusion of carriers from an area of the conductor portions 105 near the channel portion 104 to the channel portion 104 in a conductorize process of the semiconductor layer 103 and to reduce a difference between a length of the actually formed channel portion 104 and a length of an expected channel portion 104. By providing the ratio of the second length L2 of the actually formed channel portion 104 to the first length L1 of the first gate electrode 106 greater than 0.7 and less than or equal to 1, it is conducive to improve the failure of the thin film transistors 102 caused by excessive negative threshold voltages, thereby improving the device performance of the thin film transistors.

Referring to FIG. 1, the ratio of the second length L2 to the first length L1 can be 1. Please refer to FIG. 2, the ratio of the second length L2 to the first length L1 can be less than 1. When the ratio of the second length L2 to the first length L1 is less than 1, the ratio of the second length L2 to the first length L1 is greater than 0.7 and is less than 1.

In some embodiments, the ratio of the second length L2 to the first length L1 is greater than or equal to 0.8 and is less than or equal to 1. In an embodiment, the ratio of the second length L2 to the first length L1 ranges from 0.8128 to 1. Through experimental researches, the inventor found that when the ratio of the second length L2 to the first length L1 ranges from 0.8 to 1, when the ratio of the second length L2 to the first length L1 ranges from 0.8128 to 1, the threshold voltages of the thin film transistors 102 are easy to be controlled at a value close to 0 V, which is conducive to improving the failure of the thin film transistors caused by excessive negative threshold voltages, thereby improving the device performance of the thin film transistors. For example, when the ratio of the second length L2 to the first length L1 ranges from 0.8128 to 1, a sampling of the threshold voltages of the thin film transistors at different points of the display motherboard in the process of manufacturing the display panel 100 is found ranging from −0.76V to 0.22V, and the threshold voltages of the thin film transistors obtained at different sampling points are generally close to 0 V, and the differences of the threshold voltages between the thin film transistors at different sampling points is smaller, which not only improves the problem of failure of the thin film transistors, but also reduces differences of the product quality of the display motherboard between different display panels 100, and improves the product quality of the display panel 100.

In the top view direction of the display panel 100, the first length L1 can be 8 μm, and the second length L2 can range from 5.6 μm to 8 μm. In an embodiment, the second length L2 can range from 6.4 μm to 8 μm, and further, the second length L2 can range from 6.5024 μm to 8 μm.

In some embodiments, the display panel 100 further includes a gate insulating layer 107 located between the first gate electrode 106 and the semiconductor layer 103, and the gate insulating layer 107 includes blocking portions 108 located on both sides of the first gate electrode 106. In the top view direction of the display panel 100, the blocking portions 108 are located within a projection of the first concentration area A1.

By providing the gate insulating layer 107, in a manufacturing process of the thin film transistors, the blocking portions 108 can protect a part of the semiconductor layer located below the blocking portions 108 during a conductorize manufacturing process of the semiconductor layer. It can avoid a direct conductorizing of the part of the semiconductor layer, so that a carrier concentration of parts of the conductor portions formed in the first concentration area A1 is less than a carrier concentration of parts of the conductor portions formed in the second concentration area A2, thereby avoiding diffusion of carriers from the conductor portions 105 near the channel portion 104 to the channel portion 104 due to a higher carrier concentration, so as to avoid the failure of the thin film transistors caused by a length of the channel portion 104 less than the expected length in the top view direction of the display panel 100.

Because the blocking portions 108 can block the first concentration area A1 in the conductorize process of the semiconductor layer, carriers of the conductor portions 105 located in the first concentration area A1 are came from carriers of the conductor portions 105 located in the second concentration area A2 by a carrier diffusion action of in a finally formed display panel 100. Therefore, the carrier concentration of the conductor portions 105 located in the first concentration area A1 close to the side of the second concentration area A2 is greater than the carrier concentration of the conductor portions 105 located in the first concentration area A1 close to the side of the channel portion 104. It is conducive to further reducing the carrier diffusion from the area of the conductor portions 105 close to the channel portion in the conductorize process of the semiconductor layer, so as to reduce a difference between a length of the actually formed channel portion and a length of the expected channel portion. By keeping the ratio of the second length L2 of the actually formed channel portion 104 to the first length L1 of the first gate electrode 106 greater than 0.7 and less than or equal to 1, it is conducive to improving failure of the thin film transistors caused by the excessive negative threshold voltages, thereby improving the device performance of the thin film transistors.

A material of the gate insulating layer 107 can be silicon oxide or silicon nitride, and a thickness of the gate insulating layer 107 ranges from 1000 nm to 3000 nm, which can effectively block the direct conductorize of the corresponding area of the conductor portions 105 in the conductorize process of the semiconductor layer.

In some embodiments, the blocking portions 108 include a first blocking sub-portion 109 located at one side of the first gate electrode 106 and a second blocking sub-portion 110 located at another one side of the first gate electrode 106. The conductor portions 105 includes a first conductor sub-portion located at one side of the channel portion 104 and a second conductor sub-portion located at another one side of the channel portion 104.

In the top view direction of the display panel 100, the first blocking sub-portion 109 is located within a projection of a part of the first concentration area A1 where the first conductor sub-portion is located, and the second blocking sub-portion 110 is located within a projection of a part of the first concentration area A1 where the second conductor sub-portion is located.

In the top view direction of the display panel 100, the first blocking sub-portion 109 is defined with a third length d1, and the second blocking sub-portion 110 is defined with a fourth length d2.

In the top view direction of the display panel 100, the first blocking sub-portion 109 includes a seventh side close to the first gate electrode 106 and an eighth side away from the first gate electrode 106. The third length d1 is a distance between the seventh side and the eighth side. The second blocking sub-portion 110 includes a ninth side close to the first gate electrode 106 and a tenth side away from the first gate electrode 106, and the fourth length d2 is a distance between the ninth side and the tenth side.

By controlling the third length d1 and the fourth length d2, a final formed length of the first concentration area A1 can be controlled, thereby enabling the second length L2 of an actual channel portion 104 to be controlled. The third length d1 is greater than 0.85 μm and is less than or equal to 1.8 μm. The fourth length d2 is greater than 0.85 μm and is less than or equal to 1.8 μm. When the third length d1 and the fourth length d2 are less than 0.85 μm, a length of the first barrier sub-portion 109 and a length of the second barrier sub-portion 110 are too short, resulting in a poor blocking effect. As a result, the length of the actually formed channel portion 104 is shorter, and the ratio to the length of the first gate electrode 106 is even less than or equal to 0.7, which makes it difficult to actually improve the performance of the thin film transistors 102. When the third length d1 and the fourth length d2 are greater than 1.8 μm, the length of the first blocking sub-portion 109 and the length of the second blocking sub-portion 110 are too long, which leads to form the actually formed channel portion 104 with a too long length, or the ratio to the length of the first gate electrode 106 even being greater than 1, therefore, the problem of incontrollable the switches of the thin film transistors 102 easily occurs, thereby affecting product quality of the thin film transistors 102.

In detail, through experimental researches, the inventor found that when the third length d1 and the fourth length d2 are less than or equal to 0.85 μm, the length of the first barrier sub-portion 109 and the length of the second barrier sub-portion 110 are too short, and the ratio of the second length L2 of the actually formed channel portion 104 to the first length L1 of the first gate electrode 106 is less than or equal to 0.7, which leads to the negative threshold voltages of the thin film transistors, thereby failure of the thin film transistors occurring. For example, when the third length d1 and the fourth length d2 are 0.85 μm, the ratio of the second length L2 to the first length L1 ranges from 0.65 to 0.7, the sampled threshold voltages of the thin film transistors at different points of the display motherboard in the process of manufacturing the display panel 100 range from −19.7V to −3.7V. That is, the threshold voltages of the thin film transistors obtained at different sampling points are generally negative, and the differences of the threshold voltages between the thin film transistors at the different sampling points are greater. It causes not only the failure of the thin film transistors, but also difficulty in control the product quality of the display motherboard between different display panels.

At the same time, through experiments, the inventor found that the carriers in the second concentration area A2 has a limited diffusion distance to the first concentration area A1, the diffusion distance ranges from 1.2 μm to 1.8 μm, and usually is 1.5 μm. That is, the length of the first concentration area A1 ranges from 1.2 μm to 1.8 μm, and usually is 1.5 μm. When the third length d1 and the fourth length d2 range from 1.2 μm to 1.8 μm, which match the diffusion distance, the ratio of the second length L2 of the channel portion 104 to the first length L1 of the first gate electrode 106 ranges from 0.8 to 1, the threshold voltage of the thin film transistor is closer to 0 V. The problem of the thin film transistors failure is improved. Because the threshold voltage is closer to 0 V, power consumption required for switching the thin film transistors is reduced. It is conducive to reducing power consumption of the display panel 100 and improving the product quality of the display panel 100. For example, when the third length d1 and the fourth length d2 are 1.4 μm, and the ratio of the second length L2 to the first length L1 ranges from 0.8 to 1, more specifically, the ratio of the second length L2 to the first length L1 ranges from 0.812 to 1, the sampled threshold voltages of the thin film transistors at different points of the display motherboard in the process of manufacturing the display panel 100 range from −0.76V to 0.22V, the threshold voltages of the thin film transistors obtained at different sampling points are generally close to 0 V, and the differences of the threshold voltages between the thin film transistors at different sampling points is smaller. It not only improves the problem of the thin film transistors failure, but also reduces differences of the product quality of the display motherboard between different display panels 100, and improves the product quality of the display panel 100.

In some embodiments, the semiconductor layer 103 further includes an eleventh side connecting the third side and the fourth side. A length of the eleventh side is the same as a width of the semiconductor layer 103, and the width of the semiconductor layer 103 can be 10 μm.

In some embodiments, types of the thin film transistors 102 can be metal oxide thin film transistors or low-temperature polysilicon thin film transistors. In an embodiment that the thin film transistors 102 are the metal oxide thin film transistors, a material of the semiconductor layer 103 can include IGZO. In another embodiment that the thin film transistors 102 are the low temperature polysilicon thin film transistors, the material of the semiconductor layer 103 can include polysilicon. A thickness of the semiconductor layer 103 can range from 200 nm to 800 nm.

The conductorize process of the semiconductor layer of the thin film transistors 102 can be implemented by a plasma process, and plasmas can be plasmas containing CF4 or plasmas containing CF4 and O2. Alternatively, the plasmas can be plasmas containing P or B. When the plasmas are the plasmas containing P or B, the display panel 100 further includes an interlayer insulating layer 111, the interlayer insulating layer 111 covers parts of the semiconductor layer 103, the blocking portion 108, and the first gate electrode 106. An ion concentration of the blocking portion 108 is greater than an ion concentration of the interlayer insulating layer 111.

A material of the interlayer insulating layer 111 can be silicon oxide or silicon nitride, and a thickness of the interlayer insulating layer 111 ranges from 2000 nm to 8000 nm. In the display panel 100, the material of the gate insulating layer 107 and the material of the interlayer insulating layer 111 can be the same or different.

The thin film transistors 102 further includes a source-drain electrode 112 located on the semiconductor layer 103, and the source-drain electrode 112 is electrically connected to the conductor portions 105 through vias passing through the interlayer insulating layer 111. The source-drain electrode 112 includes a source electrode and a drain electrode, the source electrode and the drain electrode are located on both sides of the first gate electrode 106, respectively. The source electrode is connected to the first conductor sub-portion, and the drain electrode is connected to the second conductor sub-portion. A material of the source-drain electrode 112 can include metal or alloy selected from the group of Mo, Al, Cu, Ti, etc. A thickness of the source-drain electrode 112 can range from 2000 nm to 80000 nm.

The display panel 100 further includes a first gate electrode signal line arranged on the same layer with the first gate electrode 106. The first gate electrode signal line includes scanning signal lines. The scanning signal lines are connected to the first gate electrode 106, so as to provide scanning signals to the first gate electrode 106. A material of the first gate electrode 106 can include metal or alloy selected from the group of Mo, Al, Cu, Ti, etc. A thickness of the first gate electrode 106 can range from 2000 nm to 80000 nm.

The display panel 100 further includes a source-drain signal line arranged on the same layer with the source-drain electrode 112, and the source-drain signal line includes data signal lines. The data signal lines are connected to the source electrode or the drain electrode, so as to provide data signals to the source-drain electrode 112. In the top view direction of the display panel 100, the scanning signal lines intersect the data signal lines.

The display panel 100 further includes a passivation layer 115 disposed on the source-drain electrode 112. A material of the passivation layer 115 can be silicon oxide or silicon nitride, and a thickness of the passivation layer 115 ranges from 1000 nm to 5000 nm.

The display panel 100 further includes a light-emitting device layer disposed on the passivation layer 115, and the light-emitting device layer includes an anode layer disposed on the passivation layer 115, a light-emitting material layer disposed on the anode layer, and a cathode layer disposed on the light-emitting material layer. The display panel 100 includes a display area, the anode layer includes an anode located in the display area, and the anode is connected to one of the drain electrode or the source electrode that is not directly connected to the data signal line in a thin film transistor located in the display area.

The display panel 100 further includes a pixel definition layer disposed on the same layer with the light-emitting material layer, a polarizing layer disposed on the light-emitting device layer, and a cover plate disposed on the polarizing layer. The display panel 100 further includes a corresponding adhesive layer located between the polarizing layer and the cover plate. The cover plate can be a flexible cover plate, and a material of the flexible cover plate can be polyimide. The polarizing layer can include a polarizing sheet, or the polarizing layer can include a color resistor and a black matrix located on both sides of the color resistor.

In some embodiments, each of the thin film transistors 102 further includes a second gate electrode 113 located between the substrate 101 and the semiconductor layer 103. In the top view direction of the display panel 100, the semiconductor layer 103 is located within a projection of the second gate electrode 113. The second gate electrode 113 is used to shield interference of external light from a side of the substrate 101 to the semiconductor layer 103, which is conducive to improving the performance of the thin film transistors 102. A material of the second gate electrode 113 can include metal or alloy selected from the group of Mo, Al, Cu, Ti, etc., and a thickness of the second gate electrode 113 can range from 2000 nm to 80000 nm.

The display panel 100 further includes a buffer layer 114 disposed between the second gate electrode 113 and the semiconductor layer. A material of the buffer layer 114 can be silicon oxide or silicon nitride, and a thickness of the buffer layer 114 can range 5000 nm to 10000 nm.

In this embodiment, by keeping the ratio of the second length L2 of the channel portion 104 to the first length L1 of the first gate electrode 106 greater than 0.7 and less than or equal to 1 in the top view direction of the display panel 100, the threshold voltage of each of the thin film transistors 102 is closer to 0 V, thereby improving the problem of the thin film transistors 102 failure caused by the excessive negative threshold voltages, so as to improve the device performance of the thin film transistors.

Figure 5A:
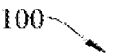
FIG. 5A to FIG. 5F are schematic diagrams showing a process of the method of manufacturing the display panel provided by the embodiment of the present application.
Figure 5A:
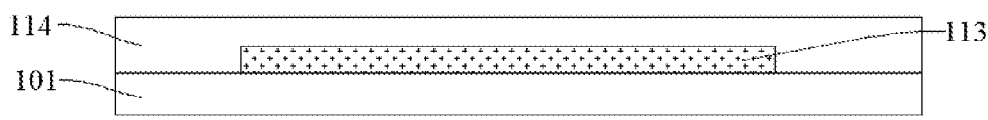
Figure 5B:
Figure 5B:
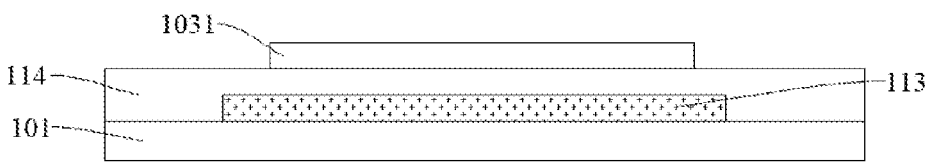

Referring to FIG. 1 to FIG. 4, and FIG. 5A to FIG. 5F. An embodiment of the present application further provides a method of manufacturing the display panel 100, which includes:

Referring to FIG. 5A and FIG. 5B. A step S100: forming a semiconductor material layer 1031 on a substrate 101.

In some embodiments, the step S100 includes:

step S101: cleaning and pre-baking the substrate 101.

step S102: forming a second gate electrode 113 on the substrate 101.

step S103: forming a first material layer on the second gate electrode 113.

step S104: patterning the first material layer to form the semiconductor material layer.

The second gate electrode 113 can include metal or alloy selected from the group of Mo, Al, Cu, Ti, etc., and a thickness of the second gate electrode 113 can range from 2000 nm to 80000 nm.

Figure 5C:
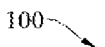
Figure 5C:
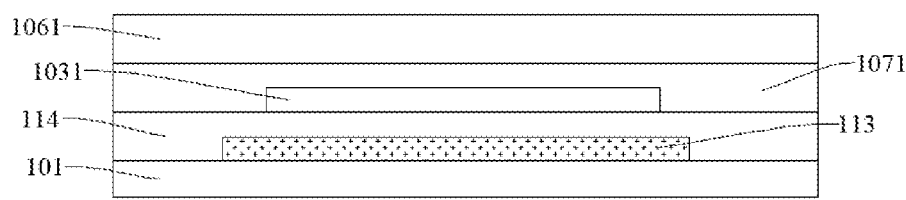

Referring to FIG. 5C, step S200: forming a barrier material layer 1071 on the semiconductor material layer 1031.

In some embodiments, the step S200 includes:

step S201: covering the semiconductor material layer 1031 with a full layer of barrier materials to form the barrier material layer 1071.

Please refer to FIG. 5C, step S300: forming a first metal layer 1061 on the barrier material layer 1071.

In some embodiments, the step S300 includes:

step S301: covering the barrier material layer 1071 with a full layer of first metal to form the first metal layer 1061.

Figures 5D, 5E:
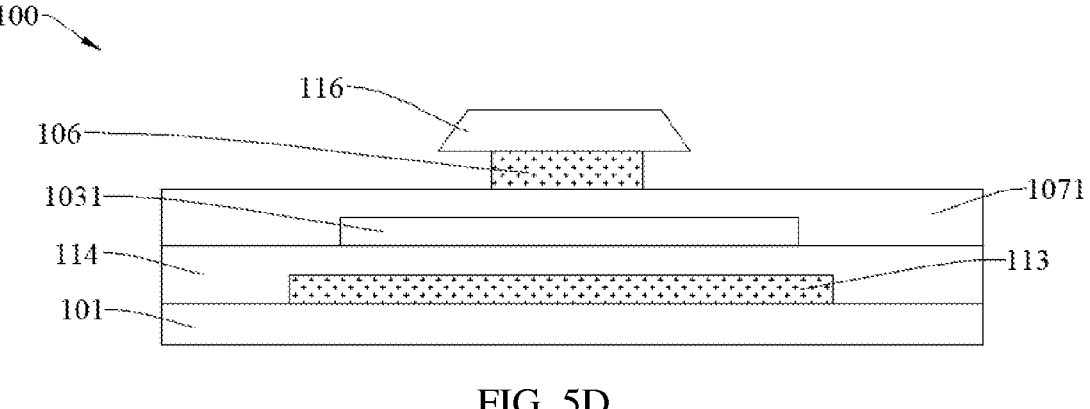

Referring to FIG. 5D to FIG. 5E, step S400: patterning the first metal layer 1061 and the barrier material layer 1071 to form a first gate electrode 106 and a gate insulating layer 107, and to expose a part of the semiconductor material layer 1031.

In some embodiments, the step S400 includes:

step S401: performing a first patterning treatment on the first metal layer 1061 to form the first gate electrode 106.

The step S401 includes:

step S401a: forming a photoresist layer 116 on the first metal layer 1061.

A material of the photoresist layer 116 is a photoresist material. Because a material composition is not a focus of the present application, specific definition will not be described here.

step S401b: defining a first pattern of the photoresist layer 116, the first metal layer 1061, and the barrier material layer 1071 by a patterning process, wherein the photoresist layer is formed as a patterned photoresist, and the first metal layer 1061 is formed as the first gate electrode 106.

In step S401b, the patterning process includes an etching process to the first metal layer 1061, and the etching process can be wet etching.

When the first gate electrode 106 is formed from the first metal layer 1061 through the wet etching, due to excessive etching, in the first pattern, an orthographic projection of the patterned photoresist on the substrate 101 covers an orthographic projection of the first gate electrode 106 on the substrate. An excessive etching degree of the wet etching can be controlled by adjusting an etching time. Therefore, the first length of an actually formed first gate electrode 106 is controllable. The patterned photoresist corresponding to the first length L1 of the first gate electrode 106 is defined as a fifth length, the fifth length is controllable, and the fifth length is greater than the first length L1.

step S402: performing a second patterning treatment on the barrier material layer 1071 to form the gate insulating layer 107, and to expose the part of the semiconductor material layer 1031.

In some embodiments, the second patterning treatment includes a dry etching process to the barrier material layer 1071 to form the gate insulating layer 107.

In some embodiments, the fifth length of the patterned photoresist is greater than the first length L1 due to the excessive etching of the wet etching in step S401b. Therefore, an orthographic projection of the gate insulating layer formed by dry etching on the substrate 101 covers the orthographic projection of the first gate electrode 106 on the substrate 101. In detail, in the top view direction of the display panel 100, a part of the gate insulating layer 107 exceeding the first gate electrode 106 is defined as the blocking portions 108. The blocking portions 108 include the first blocking sub-portion 109 disposed at one side of the first gate electrode 106 and the second blocking sub-portion 110 disposed oppositely at another side of the first gate electrode 106. In the top view direction of the display panel 100, the first blocking sub-portion 109 is defined with a third length d1 and the second blocking sub-portion 110 is defined with a fourth length d2. The third length d1 is greater than 0.85 μm and is less than or equal to 1.8 μm. The fourth length d2 is greater than 0.85 μm and is less than or equal to 1.8 μm. In an embodiment, the third length d1 is greater than or equal to 1.2 μm and is less than or equal to 1.8 μm. The fourth length d2 is greater than or equal to 1.2 μm and is less than or equal to 1.8 μm.

In some embodiments, the material of the first gate electrode 106 can be IGZO or polysilicon, and the thickness of the semiconductor layer 103 can range from 200 nm to 800 nm.

The material of the first gate electrode 106 can include metal or alloy selected from the group of Mo, Al, Cu, Ti, etc. The thickness of the first gate electrode 106 can range from 2000 nm to 80000 nm. The material of the gate insulating layer 107 can be silicon oxide or silicon nitride, and the thickness of the gate insulating layer 107 ranges from 1000 nm to 3000 nm.

In some embodiments, the step S400 further includes:

step S403: removing the photoresist layer 116.

Figure 5F:
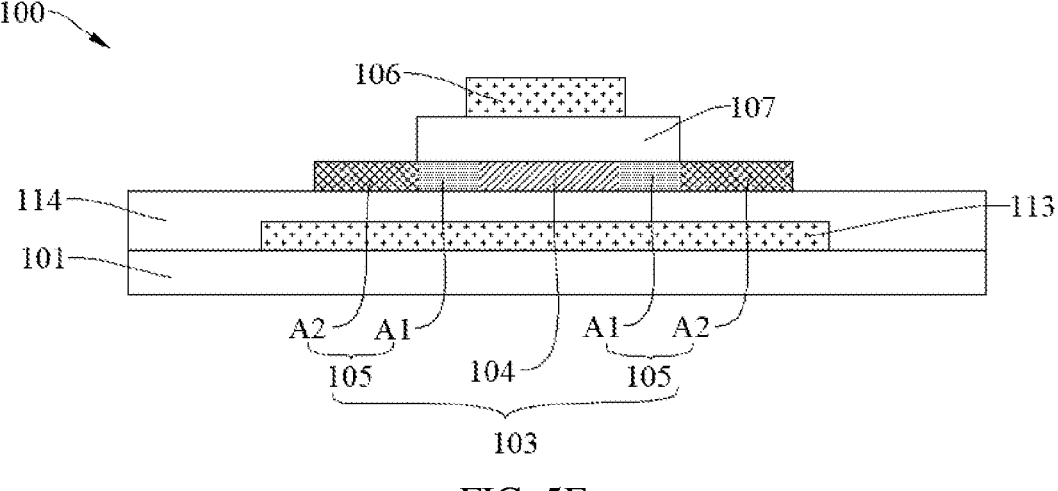

Referring to FIG. 5F, step S500: conductorizing the semiconductor material layer 1031 to form the semiconductor layer 103.

The semiconductor layer 103 includes the channel portion 104 and the conductor portions 105 located on both sides of the channel portion 104.

The orthographic projection of the channel portion 104 on the substrate 101 is located in the orthographic projection of the first gate electrode 106 on the substrate 101. The first gate electrode 106 is defined with a first length L1 and the channel portion 104 is defined with a second length L2. The ratio of the second length L2 to the first length L1 is greater than 0.7 and is less than or equal to 1.

In some embodiments, the step S500 includes:

step S501: conductorizing the exposed semiconductor material layer 1031 by a plasma process to form the semiconductor layer 103.

In this embodiment, plasma gases using in a process to reduce resistance by bombardment can be, for example, He, Ar, CF4, or He, Ar, CF4, O2, etc. CF4 or O2 can be measured and indicates a content of F or a content of oxygen hole in the semiconductor layer 103 of a final product.

However, contents of He and Ar is not easily to be measured, an oxygen vacancy concentration can be used to distinguish different areas.

Each of the conductor portions includes a first concentration area and a second concentration area. The first concentration area is located at a side of the conductor portion close to the channel portion, and the second concentration area is located at a side of the first concentration area away from the channel portion. A carrier concentration of the parts of the conductor portions in the first concentration area is less than a carrier concentration of the parts of the conductor portions in the second concentration area.

In some embodiments, the method of manufacturing the display panel 100 further includes:

step S600: forming an interlayer insulating layer 111 on the semiconductor layer 103, the gate insulating layer 107, and the first gate electrode 106. The interlayer insulating layer 111 is defined with vias exposing the conductor portions 105.

The material of the interlayer insulating layer 111 can be silicon oxide or silicon nitride, and the thickness of the interlayer insulating layer 111 ranges from 2000 nm to 8000 nm. In the same display panel 100, the material of the gate insulating layer 107 and the material of the interlayer insulating layer 111 can be the same or different.

step S700: forming a source-drain electrode 112 on the interlayer insulating layer 111. The source-drain electrode 112 includes a source electrode and a drain electrode.

The source electrode and the drain electrode are connected to the semiconductor layer 103 through the vias. The material of the source-drain electrode 112 can include metal or alloy selected from the group of Mo, Al, Cu, Ti, etc. The thickness of the source-drain electrode 112 can range from 2000 nm to 80000 nm.

step S800: forming a passivation layer 115 on the source-drain electrode 112.

The material of the passivation layer 115 can be silicon oxide or silicon nitride, and the thickness of the passivation layer 115 ranges from 1000 Å to 5000 Å.

In the method of manufacturing the display panel 100 provided by the present application, by keeping the ratio of the second length L2 of the channel portion 104 to the first length L1 of the first gate electrode 106 greater than 0.7 and less than or equal to 1 in the top view direction of the display panel 100, the threshold voltage of each of the thin film transistors 102 is closer to 0 V, thereby improving the problem of the thin film transistors 102 failure caused by excessive negative threshold voltages, so as to improve the device performance of the thin film transistors.

Figure 6:
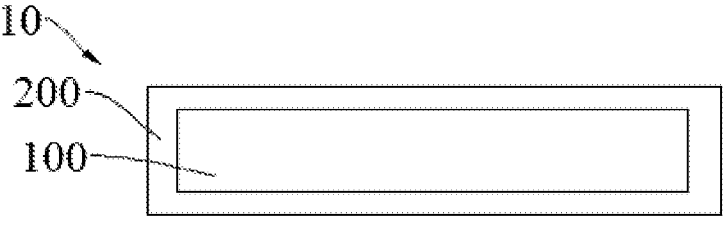
FIG. 6 is a schematic structural diagram of a display device provided by an embodiment of the present application.

Referring to FIG. 6. An embodiment of the present application further provides a display device 10 including the display panel 100 as described above and a device body 200, the device body 200 is integrated with the display panel 100 as a whole.

For a detail structure of the display panel 100, please refer to the embodiments and drawings of any of the above display panels.

In this embodiment, the device body 200 can include a middle frame, a frame resin, etc., and the display device 10 can be a mobile phone, a tablet, a TV, and other display terminals, which is not limited here.

Embodiments of the present application discloses the display panel, the method of manufacturing the same, and the display device. The display panel includes the substrate and the plurality of thin film transistors disposed on the substrate. Each of the thin film transistors includes: the semiconductor layer disposed on the substrate, and the first gate electrode disposed on the semiconductor layer. The semiconductor layer includes the channel portion and the conductor portions disposed on both sides of the channel portion. The orthographic projection of the channel portion on the substrate is located within the orthographic projection of the first gate electrode on the substrate. The gate electrode is defined with the first length, the channel portion is defined with the second length, and the ratio of the second length to the first length is greater than 0.7 and is less than or equal to 1. In the present application, by keeping the ratio of the second length of the channel portion to the first length of the gate electrode greater than 0.7 and less than or equal to 1 in the top view direction of the display panel, the threshold voltage of the thin film transistors is closer to 0 V, thereby improving the problem of the thin film transistors failure caused by excessive negative threshold voltages, so as to improve the device performance of the thin film transistors.

The display panel, the method of manufacturing the same, and the display device provided by the embodiment of the present application are described in detail. In this application, specific examples are used to explain a principle and an implementation mode of the present invention. The description of the above embodiments are only used to help understand the method and a core idea of the present application. For those skilled in the art, according to the idea of the present invention, there will be changes in the specific implementation mode and the scope of application. In conclusion, contents of the specification should not be interpreted as a limitation of the present application.

What is claimed is:

1. A display panel, comprising a substrate and a plurality of thin film transistors located on the substrate, wherein each of the thin film transistors comprises:

a semiconductor layer located on the substrate, wherein the semiconductor layer comprises a channel portion and conductor portions located on two sides of the channel portion; and a gate electrode located on the semiconductor layer, wherein an orthographic projection of the channel portion on the substrate is located within an orthographic projection of the gate electrode on the substrate, the gate electrode is defined with a first length, the channel portion is defined with a second length, a ratio of the second length to the first length is greater than 0.8 and is less than 1, and a threshold voltage of each of the thin film transistors ranges from −0.76 V to 0.22V.

2. The display panel according to claim 1, wherein each of the conductor portions comprises a first concentration area and a second concentration area, the first concentration area is located at a side of a conductor portion close to the channel portion, and the second concentration area is located at a side of the first concentration area away from the channel portion; and wherein a carrier concentration of parts of the conductor portions located in the first concentration area is less than a carrier concentration of parts of the conductor portions located in the second concentration area.

3. The display panel according to claim 2, wherein the display panel further comprises a gate insulating layer located between the gate electrode and the semiconductor layer, and the gate insulating layer comprises blocking portions located at two sides of the gate electrode; and wherein the blocking portions are located within a projection of the first concentration area in a top view direction of the display panel.

4. The display panel according to claim 3, wherein the blocking portions comprise a first barrier sub-portion located at one side of the gate electrode and a second barrier sub-portion disposed oppositely at another side of the gate electrode, and in the top view direction of the display panel, the first barrier sub-portion is defined with a third length, and the second barrier sub-portion is defined with a fourth length; and wherein the third length is greater than 0.85 μm and is less than or equal to 1.8 μm, and the fourth length is greater than 0.85 μm and is less than or equal to 1.8 μm.

5. The display panel according to claim 4, wherein the third length is greater than or equal to 1.2 μm and is less than or equal to 1.8 μm, and the fourth length is greater than or equal to 1.2 μm and is less than or equal to 1.8 μm.

6. The display panel according to claim 3, wherein the display panel further comprises an interlayer insulating layer, and the interlayer insulating layer covers parts of the semiconductor layer, the blocking portion, and the gate electrode; and wherein an ion concentration of the blocking portion is greater than an ion concentration of the interlayer insulating layer.

7. The display panel according to claim 1, wherein the first length is 8 μm, and the second length is greater than or equal to 5.6 μm and is less than 8 μm.

8. The display panel according to claim 4, wherein both of the third length and the fourth length are 1.2 μm, and the ratio of the second length to the first length is greater than or equal to 0.8 and is less than 1.

9. The display panel according to claim 1, wherein each of the conductor portions comprises a first concentration area and a second concentration area, the first concentration area is located at a side of a conductor portion close to the channel portion, the second concentration area is located at a side of the first concentration area away from the channel portion, and a carrier concentration of parts of the conductor portions located in the first concentration area is less than a carrier concentration of parts of the conductor portions located in the second concentration area; and wherein the ratio of the second length to the first length is greater than or equal to 0.8 and is less than 1.

10. A display device, comprising a display panel, wherein the display panel comprises a substrate and a plurality of thin film transistors located on the substrate, and each of the thin film transistors comprises:

a semiconductor layer located on the substrate, wherein the semiconductor layer comprises a channel portion and conductor portions located on two sides of the channel portion; and a gate electrode located on the semiconductor layer, wherein an orthographic projection of the channel portion on the substrate is located within an orthographic projection of the gate electrode on the substrate, the gate electrode is defined with a first length, the channel portion is defined with a second length, a ratio of the second length to the first length is greater than 0.8 and is less than 1, and a threshold voltage of each of the thin film transistors ranges from −0.76 V to 0.22V.

11. The display device according to claim 10, wherein each of the conductor portions comprises a first concentration area and a second concentration area, the first concentration area is located at a side of a conductor portion close to the channel portion, and the second concentration area is located at a side of the first concentration area away from the channel portion; and wherein a carrier concentration of parts of the conductor portions located in the first concentration area is less than a carrier concentration of parts of the conductor portions located in the second concentration area.

12. The display device according to claim 11, wherein the display panel further comprises a gate insulating layer located between the gate electrode and the semiconductor layer, and the gate insulating layer comprises blocking portions located at two sides of the gate electrode; and wherein the blocking portions are located within a projection of the first concentration area in a top view direction of the display panel.

13. The display device according to claim 12, wherein the blocking portion comprises a first barrier sub-portion located at one side of the gate electrode and a second barrier sub-portion disposed oppositely at another side of the gate electrode, and in the top view direction of the display panel, the first barrier sub-portion is defined with a third length and the second barrier sub-portion is defined with a fourth length; and wherein the third length is greater than 0.85 µm and is less than or equal to 1.8 µm, and the fourth length is greater than 0.85 µm and is less than or equal to 1.8 µm.

14. The display device according to claim 13, wherein the third length is greater than or equal to 1.2 µm and is less than or equal to 1.8 µm, and the fourth length is greater than or equal to 1.2 µm and is less than or equal to 1.8 µm.

15. The display device according to claim 12, wherein the display panel further comprises an interlayer insulating layer, and the interlayer insulating layer covers parts of the semiconductor layer, the blocking portion, and the gate electrode; and wherein an ion concentration of the blocking portion is greater than an ion concentration of the interlayer insulating layer.

16. A method of manufacturing a display panel, comprising:

forming a semiconductor material layer on a substrate;

forming a barrier material layer on the semiconductor material layer;

forming a first metal layer on the barrier material layer;

patterning the first metal layer and the barrier material layer to form a gate electrode and a gate insulating layer, and to expose a part of the semiconductor material layer; and conductorizing the semiconductor material layer to form a semiconductor layer, wherein the semiconductor layer comprises a channel portion and conductor portions located on both sides of the channel portion respectively, an orthographic projection of the channel portion on the substrate is located within an orthographic projection of the gate electrode on the substrate, each of the gate electrode is defined with a first length, the channel portion is defined with a second length, a ratio of the second length to the first length is greater than 0.8 and is less than 1, and a threshold voltage of each of the thin film transistors ranges from −0.76 V to 0.22V.

* * * * *